(12) United States Patent
Cooney, III et al.

(10) Patent No.: US 6,534,394 B1
(45) Date of Patent: Mar. 18, 2003

(54) PROCESS TO CREATE ROBUST CONTACTS AND INTERCONNECTS

(75) Inventors: Edward C. Cooney, III, Jericho, VT (US); William J. Murphy, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 09/660,711

(22) Filed: Sep. 13, 2000

(51) Int. Cl.⁷ .......................................... H01L 21/4763
(52) U.S. Cl. ....................................... 438/622; 438/637
(58) Field of Search ................................ 438/622, 700, 438/713, 629, 673, 692, 633, 637, 701, 687, 623, 624

(56) References Cited

U.S. PATENT DOCUMENTS

| | | | |
|---|---|---|---|
| 4,492,620 A | | 1/1985 | Matsuo et al. |
| 5,830,330 A | | 11/1998 | Lantsman |
| 5,849,367 A | * | 12/1998 | Dixit et al. ................. 427/535 |
| 5,902,461 A | | 5/1999 | Xu et al. |
| 5,961,793 A | | 10/1999 | Ngan |
| 5,962,923 A | | 10/1999 | Xu et al. |
| 6,051,114 A | * | 4/2000 | Yao et al. ................. 204/192.3 |
| 6,218,302 B1 | * | 4/2001 | Braeckelmann et al. ..... 438/687 |
| 6,261,946 B1 | * | 7/2001 | Iacoponi et al. ............ 438/637 |
| 6,274,483 B1 | * | 8/2001 | Chang et al. ............... 438/640 |
| 6,342,448 B1 | * | 1/2002 | Lin et al. .................... 438/687 |
| 6,423,636 B1 | * | 7/2002 | Dordi et al. ................ 438/678 |

* cited by examiner

Primary Examiner—Matthew Smith
Assistant Examiner—Igwe Anya
(74) Attorney, Agent, or Firm—Schmeiser, Olsen & Watts; Mark F. Chadurjian

(57) ABSTRACT

A method is provided to preferably create robust contacts and interconnects by depositing a thin layer of a first conductive material on a wafer through a non-ionized deposition process. The thin layer overlays the wafer and lines any apertures in the wafer. Deposition of a first conductive material is followed by depositing another thin layer of a second conductive material by an ionized deposition process. In this manner, the second conductive material overlays the first conductive material and additionally lines the wafer and any apertures in the wafer. Furthermore, if the apertures open to underlying areas, the conductive materials that line the apertures preferably create a conductive film that can form a plurality of contacts between the conductive film and the underlying areas.

26 Claims, 10 Drawing Sheets

PROCESS TO CREATE ROBUST CONTACTS AND INTERCONNECTS

BACKGROUND OF THE INVENTION

1. Technical Field

This invention generally relates to semiconductor processing, and more specifically relates to a process to create robust contacts and interconnects.

2. Background Art

There are structures on a semiconductor wafer where a metal or other conductive film is deposited over a layer that has apertures in it. These apertures allow the metal to contact underlying structures. For example, a connection might be needed to connect a particular metal run, which is itself connected to a number of gates, to the metal film. A hole is made in an insulating film right above the metal run. When the metal film is deposited, there will be a good connection between the metal run and the metal film. The metal film may then be planarized, masked and etched, etc., to electrically connect the metal film to other devices that will control the gates.

Currently, some semiconductor processes can create relatively deep apertures. For example, "high aspect ratio vias" are connections between metal layers where the height of the hole is greater than the width of the hole. Such high aspect ratio structures can have heights that are six or more times larger than their widths.

To ensure that metal evenly covers the bases of these structures and properly lines them, ionized deposition processes have been used. Although not limited to use for these types of high aspect ratio structures, the ionized deposition process has the benefit of creating metal sputter flux with trajectories made to be more perpendicular to the surface of a semiconductor wafer. This helps cause the metal to go deep into the high aspect ratio structures.

Unfortunately, there are problems associated with ionized deposition processes. What is needed is a process that overcomes these problems and creates more robust contacts and interconnects.

DISCLOSURE OF THE INVENTION

The preferred embodiment of the present invention provides a method to create robust contacts and interconnects by depositing a thin layer of a first conductive material on a wafer through a non-ionized deposition process. The thin layer overlays the wafer and lines any apertures in the wafer. Deposition of a first conductive material is followed by depositing another thin layer of a second conductive material by an ionized deposition process. In this manner, the second conductive material overlays the first conductive material and additionally lines the wafer and any apertures in the wafer. Furthermore, if the apertures open to underlying areas, the conductive materials that line the apertures preferably create a conductive film that can form a plurality of contacts between the conductive film and the underlying areas.

One advantage of the present invention is that by following the method of the preferred embodiment, charge differentials due to non-uniform plasmas are not created across the wafer because the initial thin layer of a first conductive material is deposited through a non-ionized deposition process. Therefore, for example, transistor degradation or other device degradation will be prevented when the subsequent preferred step of ionized deposition of a second conductive material is carried out. Thus, the preferred method avoids charge differentials created by non-uniform plasmas, yet avoids a "center thick" deposition profile along the surface of the wafer. Specifically, the preferred method allows the use of non-uniform plasmas that enable sputtering to be done in an uneven "center thin" profile along the target, thereby allowing uniformity of deposition thickness to be provided on the surface of the wafer.

Another advantage of the method of the preferred embodiment is that metal interfaces created in aperture bases are not contaminated with oxide, FSG (fluorinated silica glass), SiLK (organic material sold by DOW), or other dielectric or interposed material, thereby eliminating high contact or via junction resistance.

Still another advantage of the method of the preferred embodiment is that it can augment and provide substantial improvements to the sequentially deposited tantalum nitride/tantalum (TaN/Ta) bilayer process.

The foregoing and other features and advantages of the present invention will be apparent from the following more particular description of the preferred embodiment of the invention, as illustrated in the accompanying drawings.

BEST MODE(S) FOR CARRYING OUT THE INVENTION

As discussed above, the preferred embodiment of the present invention relates to contacts, interconnects, and other similar structures formed on a semiconductor through ionized deposition processes. A more complete discussion of the problems associated with these ionized deposition processes follows in the Overview section. Because of the particular problems associated with forming contacts, interconnects, and other similar structures through ionized deposition, the Overview section is important in order to best understand the benefits and advantages of the present invention, as well as how the present invention solves these problems.

1. Overview

Figure 1:
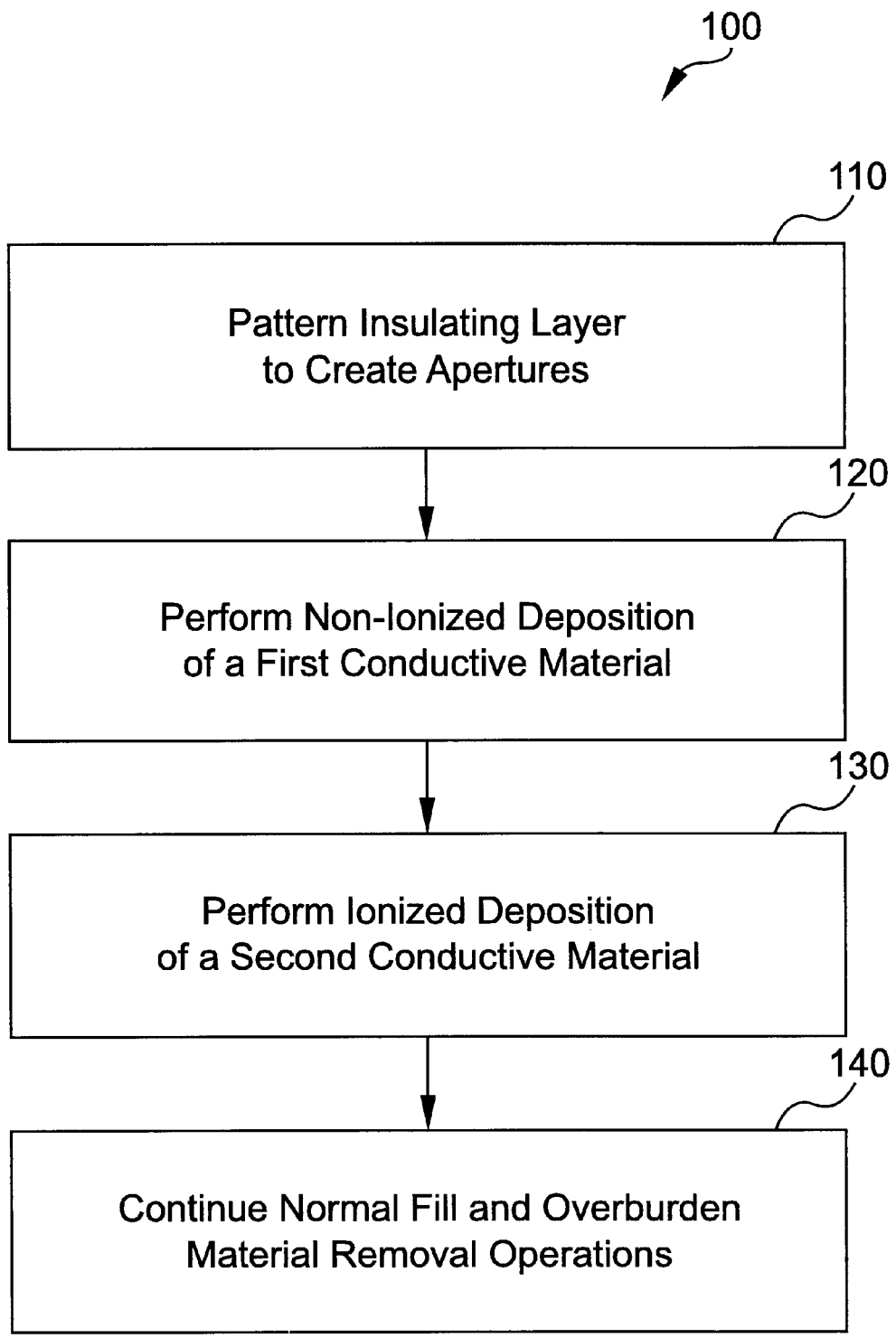
FIG. 1 is a flow diagram showing a method for creating robust contacts and interconnects according to a preferred embodiment of the present invention.
Figure 2:
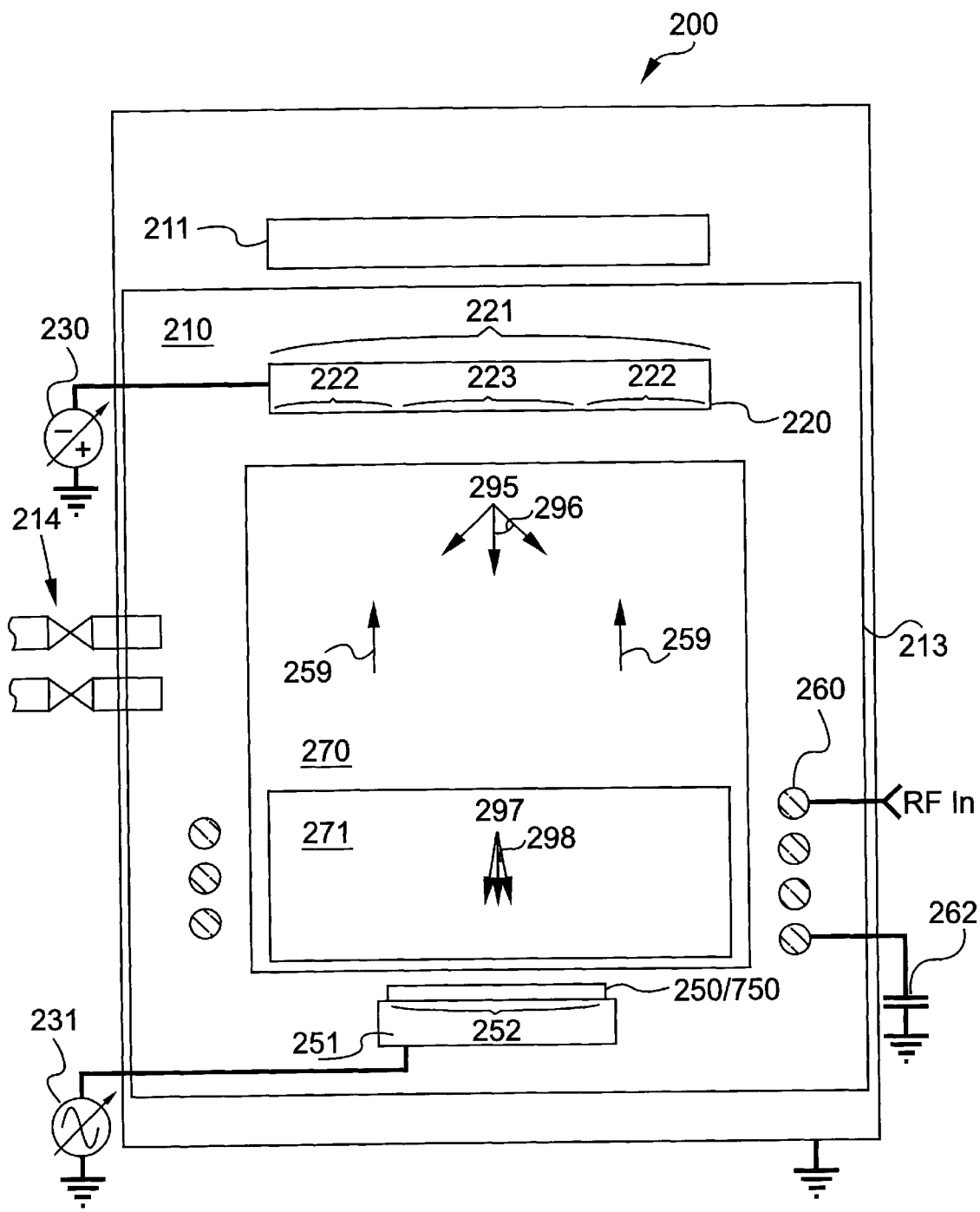
FIG. 2 is a simplified front plan view depicting a deposition apparatus in general.

FIG. 2 depicts deposition apparatus 200 that preferably is a non-ionized physical vapor deposition apparatus or an ionized physical vapor deposition apparatus, and is also helpful for illustrating both prior art conventional ionized deposition processes and preferred method 100 of FIG. 1, which will be discussed in detail hereinafter. As is known in the art, deposition apparatus 200 can include chamber 210; magnetic assembly or magnetron 211; anode or shield 213; valve system 214; target or cathode 220; DC voltage source 230; AC voltage source and optional Rf energy source 231; wafer 250/750; wafer support 251; RF coil 260; primary plasma 270; and secondary plasma 271.

Anode or conductive shield 213 may be maintained at ground potential. Valve system 214 is a series of valves that allow gas 259, such as argon, nitrogen, or other carrier gas species, to enter the chamber, while the flow of gas 259 is controlled by a mass flow controller or MFC (not shown). Target 220 is generally made of a metal, which is to be sputtered in order to be deposited as a layer on wafer 250/750. Though target 220 is shown a distance away shield 213 so that target diameter 221 might be depicted, target 220 is usually electrically isolated from shield 213, generally by phenolic resin-like materials. Diameter 221 of target 220 is generally one and a half times greater than diameter 252 of wafer 250/750. Wafer 250/750 may generally be constituted by one or a plurality of semiconductor wafers. Wafer support 251 and target 220 are normally biased to negative potentials by means of AC voltage source 231 and DC voltage source 230, respectively, though support 251 could be grounded. Support 251 can become an electrode, just as cathode or target 220 and anode or conductive shield 213 are, if optional RF energy source 231 is added to it.

When non-ionized deposition is desired, the only attenuation used in deposition apparatus 200 is magnetic assembly or magnetron 211, which provides a magnetic field that promotes the sputtering of deposition particle material from target 220. Other mechanisms of non-ionized deposition sputtering using various energy configurations, such as RF and magnets, ECR sources, and the like are available, but generally not employed. In non-ionized deposition sputtering, wafer 250/750 is close to target 220, preferably within about 50 millimeters, but can be further away in other configurations such as "long throw" where the spacing can reach 300 millimeters or more. Furthermore, primary plasma 270 is preferably very close to wafer 250/750. Moreover, non-ionized deposition is a line of sight system. That is, the sputter flux leaving target 220 is neutral, and sputter flux trajectories 295 with angles 296, along with target 220's relationship to wafer 250/750, determine whether sputter flux will hit wafer 250/750. Thus, trajectories 295 cannot be changed in non-ionized deposition.

In non-ionized deposition, the magnetic field produced by magnetic assembly or magnetron 211 creates a magnetic tunnel adjacent to target 220, within which electrons will be trapped. These electrons collide with atoms of gas 259 in primary plasma 270 creating ions of the atoms of gas 259 which are then attracted to the surface of target 220 because of the potential difference between target 220 and conductive shield 213. These ions thus bombard or sputter target 220 to dislodge deposition particle material therefrom creating sputter flux. Such sputtering causes sputter flux to have trajectories 295 with angles 296.

Non-ionized deposition processes have their problems, however. One problem in particular is that non-ionized sputter flux has a tendency to travel in straight line paths from target 220 to a wafer 250/750, often at angles 296 which are not perpendicular to the surface of wafer 250/750. If a large amount of sputter flux over an extended period of time is being deposited, the material can bridge over apertures in wafer 250/750, causing undesirable cavities, especially if apertures have a high height to width ratio (aspect ratio).

When ionized deposition is desired, attenuation in deposition apparatus 200 comes from both magnetic assembly or magnetron 211 as well as RF coil 260. RF current is supplied to RF coil 260 from an RF power source (not shown), all of which may be conventional in the art. The RF power source is connected to one end of RF coil 260, while the other end thereof is connected to ground via a dc blocking capacitor 262. RF coil 260 is electrically isolated from anodes or shields 213 so as to be at different potential. Secondary plasma 271 can be generated in chamber 210 when processing gas 259 at a sufficient pressure is subjected to an appropriate RF magnetic field produced by RF coil 260 to ionize gas 259 and maintain secondary plasma 271. At least a portion of the neutral sputter flux is ionized in secondary plasma 271 and the resulting ionized sputter flux, having a positive polarity, is attracted to wafer 250/750 at changed, more perpendicular trajectories 297 with angles 298 under the influence of the negative bias potential on support 251, if support 251 is floating as depicted in FIG. 2.

A preferred example of a prior art conventional ionized deposition apparatus that could be deposition apparatus 200 is U.S. Pat. No. 5,215,461 to Xu et al., issued May 11, 1999, and is hereby incorporated by reference into this application. The ionized deposition apparatus of U.S. Pat. No. 5,215,461 has an embodiment in an Applied Materials, Inc. device trademarked under the name IMP (Ion-Metal Plasma). U.S. Pat. No. 5,215,461 describes a system which includes a support member having a support surface for supporting a substrate; a target constituting a source of sputtering material; a coil for generating a plasma which is inductively coupled to the coil and which ionizes material sputtered from the target; and components for placing the support member at a potential which causes ionized material to be attracted to the support member. A plurality of magnets are positioned to provide a magnetic field above the support member in which substantially all of the magnetic field lines defining the field are oriented toward the support member.

Another example of a prior art conventional ionized deposition apparatus that could be deposition apparatus 200 is U.S. Pat. No. 5,178,739 to Barnes et al., issued Jan. 12, 1993. U.S. Pat. No. 5,178,739 describes a system which includes a hollow, cylindrical sputter target disposed between an end sputter target and a substrate, all of which are contained in a vacuum chamber. A plurality of magnets are disposed outside the chamber to create intense plasma regions near the interior surface of the cylindrical target and thereby cause ionization of at least a portion of the material sputtered from the target.

Figure 7:
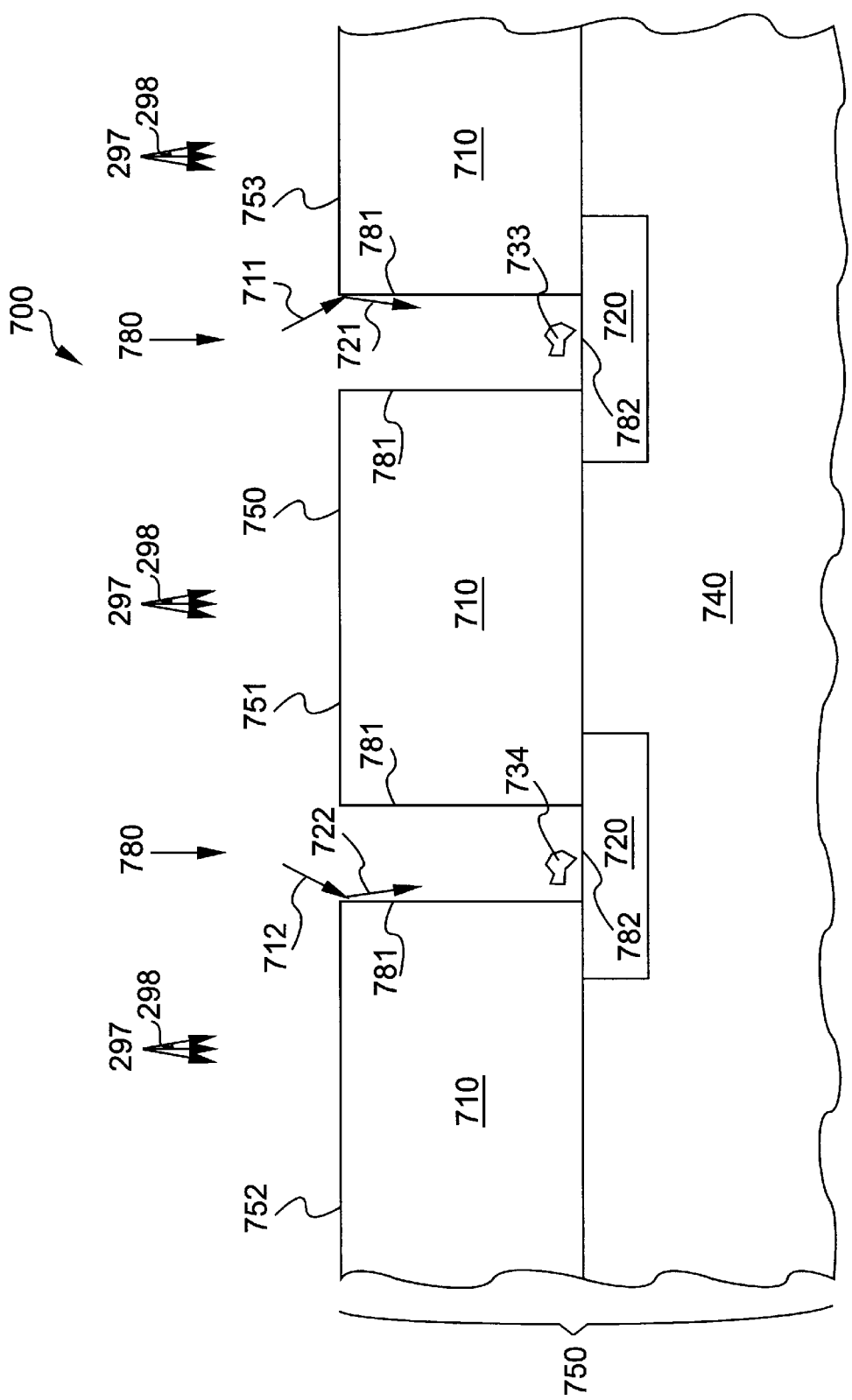
FIG. 7 is a cross-sectional view of a wafer portion intermediate in prior art conventional ionized deposition methods.

Turning to FIG. 7 in addition to FIG. 2, wafer portion 700 is depicted as an intermediate in prior art conventional ionized deposition processes. Wafer 750 includes substrate 740 and insulating layer 710. In order to line apertures 780, at least a portion of the sputter flux sputtered from target 220 has passed through secondary plasma 271 created by RF coils 260 of FIG. 2, thereby becoming ionized to a positive charge and having trajectories 297 with angles 298 that are more perpendicular to the surface of wafer 750. This increases the opportunity for the ionized sputter flux to reach aperture bases 782 of apertures 780 and not to collect on the upper reaches of aperture walls 781. However, as depicted in FIG. 7, because the ionized sputter flux has trajectories 297 with angles 298 that are not exactly perpendicular to the surface of wafer 750, the ionized sputter flux often impacts on walls 781 possibly along ionized sputter flux paths 711 and 712. If this occurs, aperture wall particles 733 and 734 from walls 781 are resputtered along possible paths 721 and 722 respectively and end up at bases 782. Resputtered particles, such as 733 and 734, are oxide, FSG (fluorinated silica glass), SiLK (organic material sold by DOW), nitride, or other dielectric or interposed material that comprise insulating layer 710. Furthermore, even before ionized sputter flux causes a resputtering effect, ionized gas 259 in FIG. 2 can cause a similar resputtering effect to take place prior to the arrival of the sputter flux.

Figure 8:
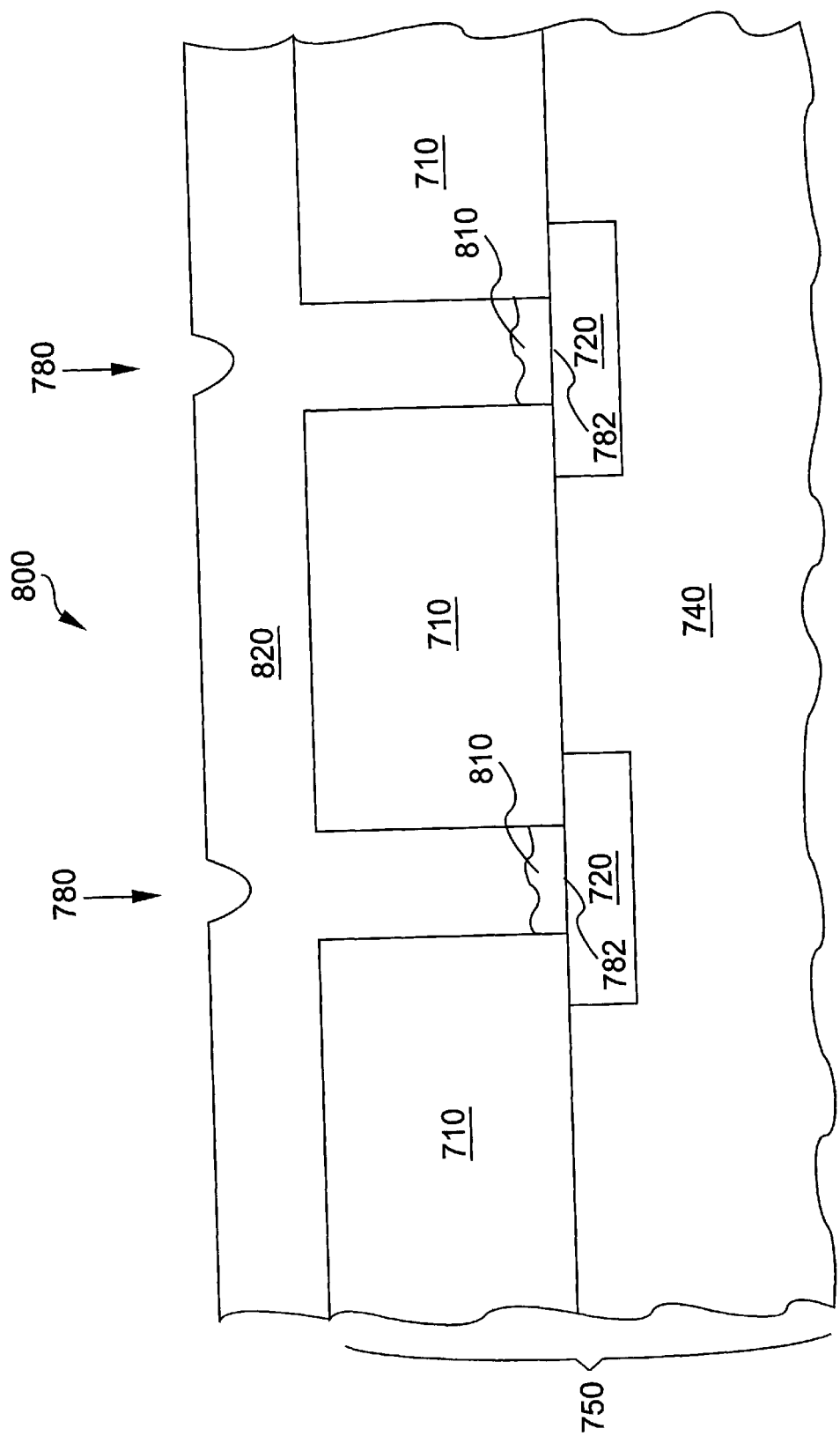
FIG. 8 is a cross-sectional view of a wafer portion that results from prior art conventional ionized deposition methods.

Referring now to FIG. 8 in addition to FIG. 2, resulting wafer portion 800 is depicted from completion of prior art conventional ionized deposition processes. Wafer 750 includes insulating layer 710 with apertures 780 lined with conductive material 820. However, the resputtering effect as depicted in FIG. 7 and described above causes contaminated metal interfaces 810 to form in aperture bases 782 between underlying areas 720 and conductive material 820, instead of metal to metal interfaces. Contaminated metal interfaces 810 create high contact or via junction resistance.

Furthermore, another consequence of ionized deposition is the creation of charge differentials caused by the early presence of ionized gas 259. Each point on target 220 is sputtered and can be sputtered at a particular angle. It's more likely, given trajectories 295 and 297 with angles 296 and 298 respectively, that there will be a higher density of central region material 223 of target 220 that goes through secondary plasma 271 and that meets the center of wafer 250/750 than meets the outer circumference of wafer 250/750, thereby causing a "center thick" deposition profile along the surface of wafer 250/750.

Returning to FIG. 7 in addition to FIG. 2, in order to achieve a uniform coverage on wafer 250/750, target 220 must be sputtered in an uneven "center thin" profile. In order to sputter target 220 unevenly, though, secondary plasma 271 of FIG. 2 is required to be non-uniform. In sputtering caused by a non-uniform plasma, the volume of central region material 223 coming off target 220 is less than the volume of end region material 222. Therefore, a uniform deposition coverage on wafer 250/750 and a high base 782 coverage occurs. However, because secondary plasma 271 is much more dominant than optional RF energy source 231 at support 251, secondary plasma 271 dominates the charge effect at wafer 750. By adding optional RF energy source 231 to support 251, this problem is amplified. By virtue of having non-uniform secondary plasma 271, a non-uniform charge across wafer 750's surface is generated, as depicted by localized areas 752, 751, 750, and 753 in FIG. 7. For example, localized area 750 is at a different potential than localized area 752. Thus, as localized areas on wafer 750's surface charge up differently, potential differences occur, such as in underlying areas 720 that are exposed, thereby causing a charge breakdown to occur in such underlying areas 720. If the charge differential is too high, transistor degradation or other device degradation may occur. The effects of charge differentials and resputtering can be seen, for example, not only in structures that contact devices and generally use titanium metallurgy, but also in copper interconnect structures that generally use tantalum metallurgy.

Thus, although ionized deposition and non-ionized deposition are known ways of lining apertures, the techniques alone are insufficient to create robust contacts and interconnects. Therefore, what is needed is a deposition method that addresses the problems caused by prior art conventional non-ionized deposition and ionized deposition processes, namely charge differentials across wafer, high contact resistance due to contaminated metal interfaces in aperture bases between underlying areas and conductive material, and cavities in apertures with high aspect ratios.

2. Detailed Description

In general and referring to FIGS. 3–6 and FIGS. 9–10, the preferred embodiment of the present invention provides a method 100 to preferably create robust contacts and interconnects that generally includes providing a semiconductor wafer 250 that includes an insulating layer 310 having a plurality of apertures 380 and a substrate 340; depositing a thin layer of first conductive material 330 in a non-ionized deposition process onto the semiconductor wafer 250, thereby lining each of the plurality of apertures 380; and depositing a second conductive material 510 in an ionized deposition process onto the semiconductor wafer 250, thereby additionally lining each of the plurality of apertures 380. Furthermore, conductive materials 330 and 510 preferably create conductive film or barrier 530, and if apertures 380 open to underlying areas 320, conductive film or barrier 530 preferably forms a plurality of contacts between conductive film or barrier 530 and underlying areas 320.

One advantage of preferred method 100 is that charge differentials due to non-uniform secondary plasma 271 are not created across wafer 250 because the initial thin layer of first conductive material 330 is deposited through preferred non-ionized deposition step 120 before deposition of second conductive material 510 through preferred ionized deposition step 130. Moreover, because the initial thin layer of first conductive material 330 is preferably a metal, it is conductive and allows charges to redistribute themselves across wafer 250. Therefore, for example, transistor degradation, other device degradation, or the like will be prevented when the subsequent preferred step 130 of ionized deposition of second conductive material 510 is carried out. Thus, preferred method 100 avoids charge differentials created by non-uniform secondary plasma 271, yet avoids the "center thick" deposition profile along the surface of wafer 250 by still allowing the use of non-uniform secondary plasma 271 that enables sputtering to be done in an uneven "center thin" profile along target 220, thereby allowing uniformity of deposition thickness to be provided on the surface of wafer 250.

Another advantage of preferred method 100 is that metal interfaces created in aperture bases 382 are not contaminated with oxide, FSG (fluorinated silica glass), SiLK (organic material sold by DOW), or other dielectric or interposed material, thereby eliminating high contact or via junction resistance, because ionized deposition step 130 is preceded by non-ionized deposition step 120. Any sputtering that occurs would sputter first conductive material 330 and not insulating layer 310.

Because preferred method 100 avoids charge differentials created by non-uniform secondary plasma 271 and avoids the increased resistance caused by contaminated metal interfaces in aperture bases 382, method 100 augments and provides substantial improvements in the sequentially deposited tantalum nitride/tantalum (TaN/Ta) bilayer process. For example, the TaN/Ta bilayer process can be augmented by step 120 non-ionized deposition of TaN immediately prior to step 130 ionized deposition of TaN. This can be achieved within the same ionized deposition apparatus 200 or by depositing a separate non-ionized TaN film in another non-ionized deposition apparatus 200. Pure Ta is then created and deposited on the surface of the TaN. This causes the creation of a low-resistance phase of Ta that is favorable for redundancy. Without the TaN under layer, no such low resistance phase can be created, and by inserting step 120 non-ionized deposition of TaN immediately before step 130 ionized deposition of TaN, charging effect and resputtering problems are alleviated.

The structures and apertures 380 contemplated in the present invention preferably relate to contact and interconnect systems and related electrical contacts/connections or via junctions. Such contact and interconnect systems can be achieved through aluminum interconnect, subtractive etching, damascene, and the like technologies. One such structure could be a filled via opening to and electrically touching underlying area 320, thereby forming an electrical contact/connection. In this example, underlying area 320 could be a transistor device or a portion of a transistor device, such as a gate, silicide region, diffusion region, a portion of a gate, silicide region, or diffusion region, or the like. Another structure could be a filled via connecting an upper interconnect or conductive material layer to underlying area 320, thereby forming an electrical contact/connection. In this example, underlying area 320 could be an underlying conductive material layer or portion of an underlying conductive material layer, and specifically, the upper conductive material layer could be an Metal 2 or M2 layer and underlying area 320 could be an Metal 1 or M1 layer, or the like. Again, because method 100 avoids charge differentials created by non-uniform secondary plasma 271 and avoids the increased resistance caused by contaminated metal interfaces in aperture bases 382, method 100 provides substantial improvements for such contact and interconnect systems and related electrical contacts/connections or via junctions.

Referring to FIG. 1, preferred method 100 is shown that creates a lining for apertures. Method 100 is used to create robust contacts and interconnects and it is performed on a silicon wafer. Other figures will be used in order to best detail method 100.

Figure 3:
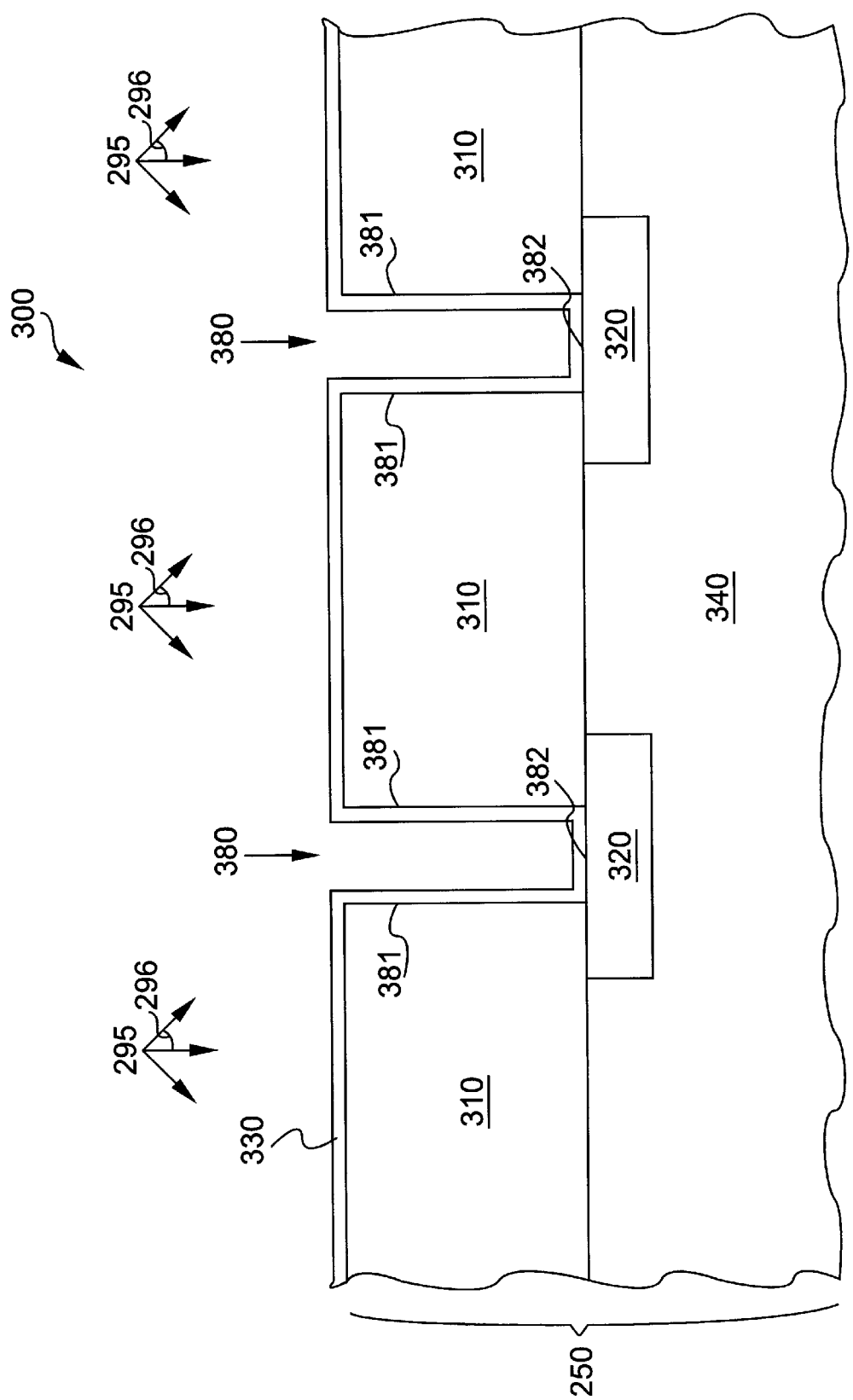
FIG. 3 is a cross-sectional view of a wafer portion intermediate in the method in FIG. 1.

With reference to FIG. 3 in addition to FIG. 1, step 110 of method 100, insulating layer 310 of semiconductor wafer 250 covers substrate 340 and is preferably patterned to create a plurality of apertures 380 as shown in wafer portion 300 of FIG. 3. Such patterning could include deposition/growth of insulating layer 310 on substrate 340, photoresist patterning, etching of insulating layer 310, etc. as is known in the art. Moreover, preferably apertures 380 open to underlying areas 320. Apertures 380 depicted in FIGS. 3–6 could be vias, holes, trenches, or the like.

Figure 9:
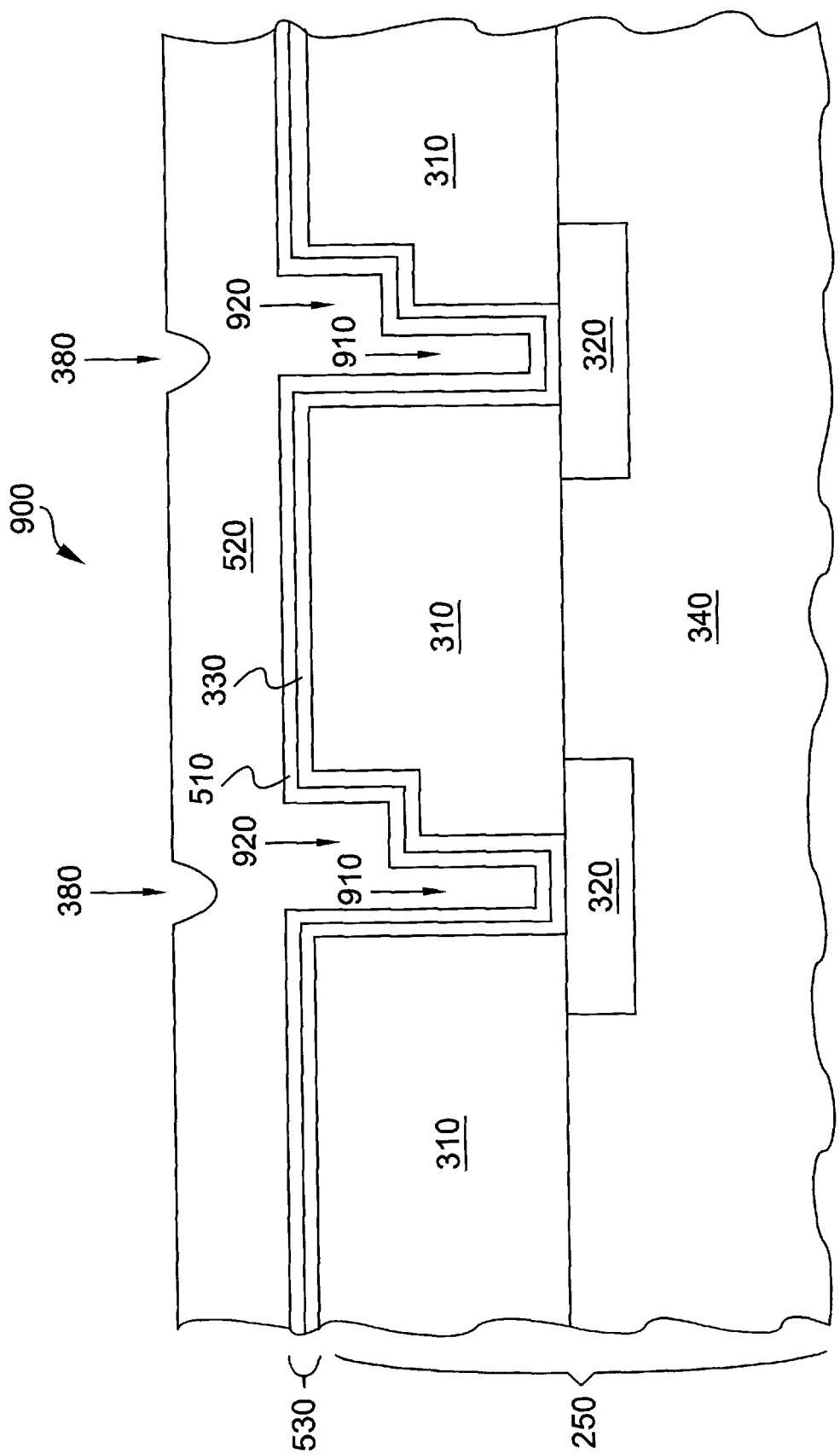
FIG. 9 is a cross-sectional view of a wafer portion intermediate in the method in FIG. 1.
Figure 10:
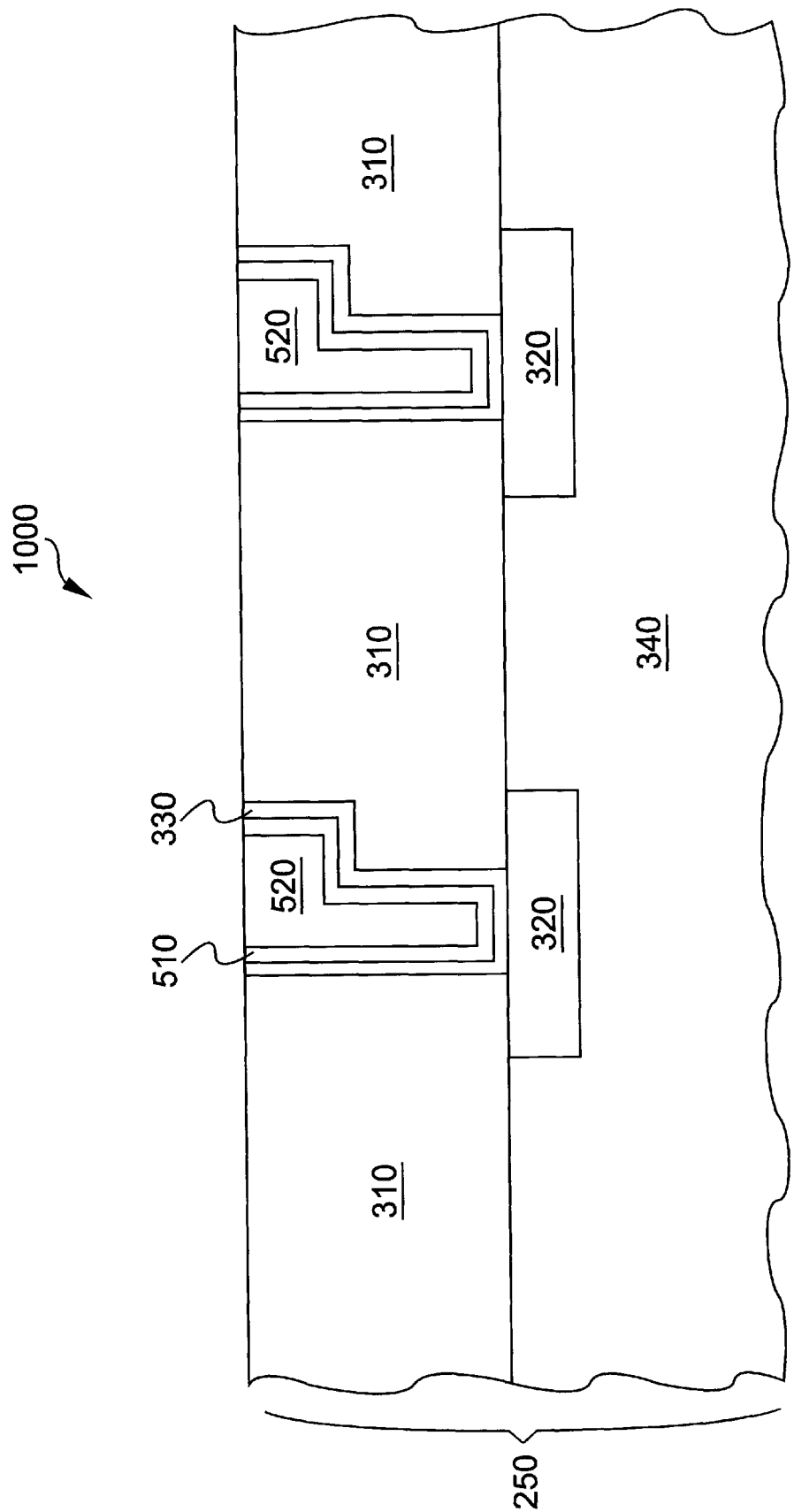
FIG. 10 is a cross-sectional view of a wafer portion that results from the method in FIG. 1.

Moreover, apertures 380 could be formed through damascene processes. Generally, in a damascene process, insulating layer 310 would be deposited first followed by photoresist application, photolithography patterning, RIE oxide etch, and filling of apertures 380 using deposition processes. For example and referring to FIG. 9, in a dual damascene process, enough insulating layer 310 is deposited such that two separate photo-etch processes are performed in series followed by filling of apertures 380. Therefore, insulating layer 310 would be deposited first followed by photoresist application, photolithography patterning, RIE oxide etch, photolithography patterning, RIE oxide etch, and filling of apertures 380 using deposition processes. The two separate photo-etch processes performed in series could be processes where either via 910 is formed first and is followed by trench 920 or trench 920 is formed first and is followed by via 910. Thus, apertures 380 depicted in FIGS. 3–6 could be the dual or double damascene structures patterned in insulating layer 310, as depicted in FIGS. 9–10, so as to preferably eventually provide for both contacts and interconnects in insulating layer 310. Furthermore, apertures 380 depicted in FIGS. 3–6 could also be damascene, triple damascene, and other derivative structures.

After step 110, in step 120, non-ionized deposition of first conductive material 330 is performed as further exemplified in more detail in FIG. 3 and in reference to FIG. 2. Step 120 preferably follows the description of non-ionized deposition as previously described in conjunction with deposition apparatus 200 of FIG. 2 in the Outline section and the description hereinafter. For non-ionized deposition step 120, target 220 constituting deposition particle material is exposed to primary plasma 270 and sputtered by ions from plasma 270. The sputter flux sputtered from target 220 is then deposited on wafer 250. The sputter flux forms a thin layer of first conductive material 330 on wafer 250 and in apertures 380 because in step 120 only a small amount of sputter flux over a limited period of time is being deposited. Non-ionized deposition step 120 of first conductive material 330 can be a non-ionized physical vapor deposition (PVD) process.

Notwithstanding, non-ionized deposition step 120 of first conductive material 330 is not limited to this description of non-ionized deposition in conjunction with deposition apparatus 200 of FIG. 2. Step 120 can be any non-ionized deposition process known in the art, such as a non-ionized chemical vapor deposition (CVD) process. Such a nonionized CVD step 120 would also be carried out for a limited time so as to form only a thin layer of first conductive material 330 on wafer 250.

Figure 4:
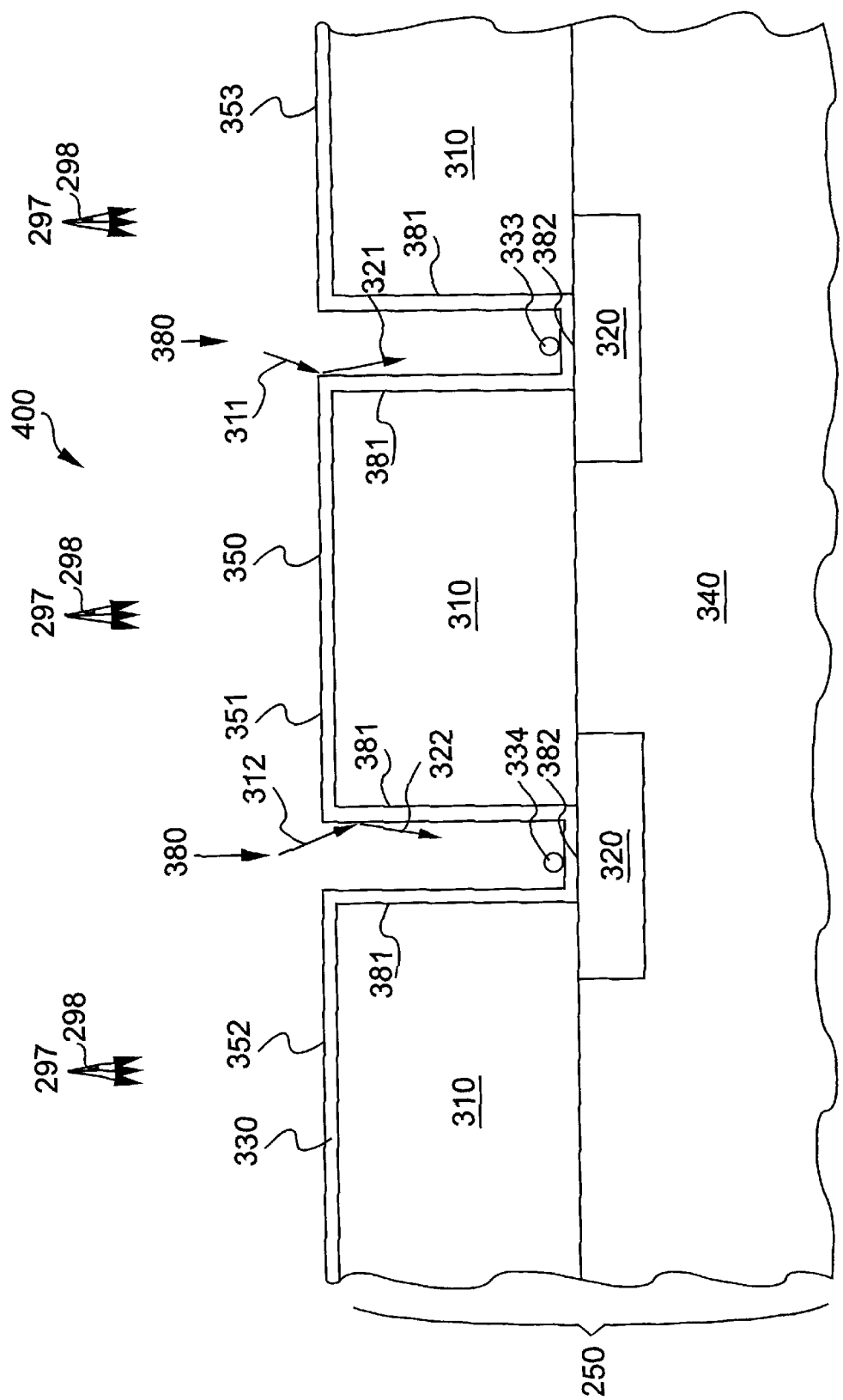
FIG. 4 is a cross-sectional view of a wafer portion intermediate in the method in FIG. 1.

Because non-ionized deposition step 120 is carried out for a limited time, thereby depositing only a thin layer of first conductive material 330, first conductive material 330 deposited in apertures 380 still adequately coats walls 381 and bases 382, yet does not form undesirable cavities. The thin layer of first conductive material 330 also reduces the effect of a charge differential across the surface of wafer 250, in that there is a uniform distribution of charge within, for example, localized areas 350–353 on wafer 250 as depicted in FIG. 4, and not charge differences between such localized areas 350–353 that can affect, for example, devices around localized areas 350–353. Furthermore, the thin layer of first conductive material 330 also negates resputtering effects as will hereinafter be described.

Figure 5:
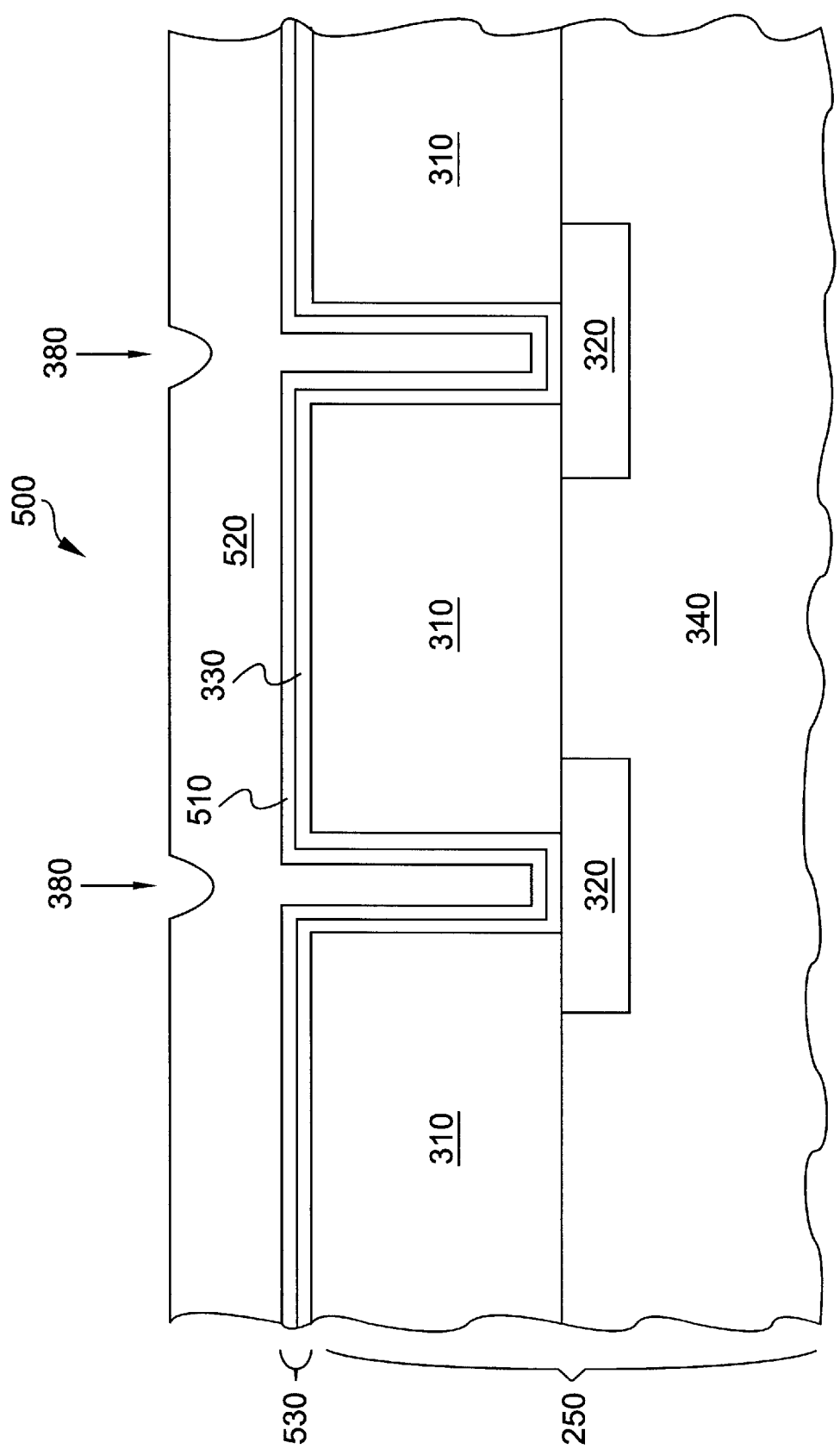
FIG. 5 is a cross-sectional view of a wafer portion intermediate in the method in FIG. 1.

Next, in step 130, ionized deposition of second conductive material 510 is performed as further exemplified in more detail by wafer portions 400–500 in FIGS. 4–5 respectively. Step 130 preferably follows the description of ionized deposition as previously described in conjunction with deposition apparatus 200 of FIG. 2 in the Outline section and the description hereinafter. Furthermore, ionized deposition step 130 preferably is an ionized physical vapor deposition (IPVD) process. Moreover, step 130 could be carried out in deposition apparatus 200 utilized by step 120, or in a different deposition apparatus 200.

For ionized deposition step 130 and referring to FIGS. 4–5 in addition to FIG. 2, RF power is inductively coupled into chamber 210 through interior RF coil 260 located between target 220 and wafer 250 to sustain secondary plasma 271. Wafer 250 is electrically biased to control the directionality and energy of the ionized sputtered material. The sputter flux produced has trajectory angles 391 that are more perpendicular to the surface of wafer 250 after crossing secondary plasma 271. Therefore, the sputter flux is capable of uniformly covering apertures 380 with second conductive material 510 over first conductive material 330, thereby at least additionally lining each aperture 380.

Furthermore, as depicted in FIG. 4 and in contrast to FIG. 7, because first conductive material 330 coats walls 381 of apertures 380, the contaminating resputtering effect of the prior art as discussed previously in the Overview section is negated because first conductive material particles 333 and 334 are only resputtered. Specifically, the ionized sputter flux impacts on first conductive material 330 coating bases 382 of apertures 380 and walls 381 of apertures 380 possibly along ionized sputter flux paths 311 and 312 respectively. As ionized sputter flux impacts on first conductive material 330 coating walls 381, first conductive material particles 333 and 334 are resputtered along possible paths 321 and 322 respectively and end up on first conductive material 330 coating bases 382. Unlike resputtered particles 733 and 734, which are oxide, FSG (fluorinated silica glass), SiLK (organic material sold by DOW), nitride, or other dielectric or interposed material that comprise insulating layer 710, resputtered first conductive material particles 333 and 334 at bases 382 do not contaminate the interfaces and add, for example, contact or via junction resistance at underlying areas 320. Furthermore, any resputtering effect caused by ionized gas 259 in FIG. 2 that takes place prior to the arrival of the ionized sputter flux is negated as well because first conductive material particles 333 and 334 are only resputtered. Moreover, ionized deposition of second conductive material 510 does not form undesirable cavities in apertures 380.

Preferably step 130 does not fill aperture 380, though step 130 could continue until each aperture 380 is filled. Furthermore, if each aperture 380 opens to underlying areas 320 and if conductive film or barrier 530 is created from first conductive material 330 and second conductive material 510, as depicted in FIG. 5, electrical contacts/connections may be formed between conductive film or barrier 530 and underlying areas 320.

As stated previously, ionized deposition step 130 can be preceded by a non-ionized CVD step 120 that negates charging and resputtering effects, as was previously described. For example, copper back-end of line structures can include non-ionized CVD step 120 of titanium nitride or tantalum-nitride followed by an ionized tantalum sputter deposition step 130, or possibly a copper sputter deposition step 130. As another example, a PVD tantalum nitride/IPVD tantalum nitride/IPVD tantalum/IPVD copper sequence could be replaced with a CVD titanium nitride/IPVD tantalum/IPVD copper sequence.

In FIG. 5, wafer portion 500 is shown after step 130 and during step 140. As seen in FIG. 5, second conductive material 510 preferably is a thin layer. Second conductive material 510 may either be the same as first conductive material 330, or different than first conductive material 330. In addition, conductive film or barrier 530 is preferably created from first conductive material 330 and second conductive material 510. The presence of conductive film or barrier 530 on side walls 381 of apertures 380 is desirable to promote adhesion and prevent structural delamination between fill material 520 and insulating layer 310. For example, in electroplating, conductive film or barrier 530 and the copper seed layer prevents diffusion of copper ions through insulating layer 310. Also, conductive film or barrier 530 and the copper seed combination serves to conduct the electroplating current over the surface of wafer 250.

In step 140, as further exemplified in more detail in FIGS. 5–6 and 9–10, wafer 250 is next subjected to normal fill and overburden material removal operations. Normal fill operations are well known in the art and fill material 520 preferably is a conductive material, and could be electroplated copper, CVD tungsten, aluminum, or other metals. Furthermore, deposition of fill material 520 could be through electroplating, CVD, IPVD, or by other various deposition techniques as is known in the art. As part of step 140 and in FIGS. 5 and 9, deposited fill material 520 preferably overlays conductive film or barrier 530 and fills apertures 380. For example, in the sequentially deposited tantalum nitride/tantalum (TaN/Ta) bilayer process and after preferable formation of conductive film or barrier 530 through steps 120 and 130, a copper seed layer is formed over conductive film or barrier 530 preferably through IPVD in deposition apparatus 200. The deposition of a copper seed layer prior to the electroplating of copper creates an environment that is more conducive to electroplating. Next, wafer 250 is removed from chamber 210. Then, through electroplating, copper forms over the copper seed layer and fills apertures 380. The copper seed layer facilitates the formation of a single crystalline copper structure at the interface at the bottom of apertures 380 because the seed layer is structurally similar to the electroplated metal.

Figure 6:
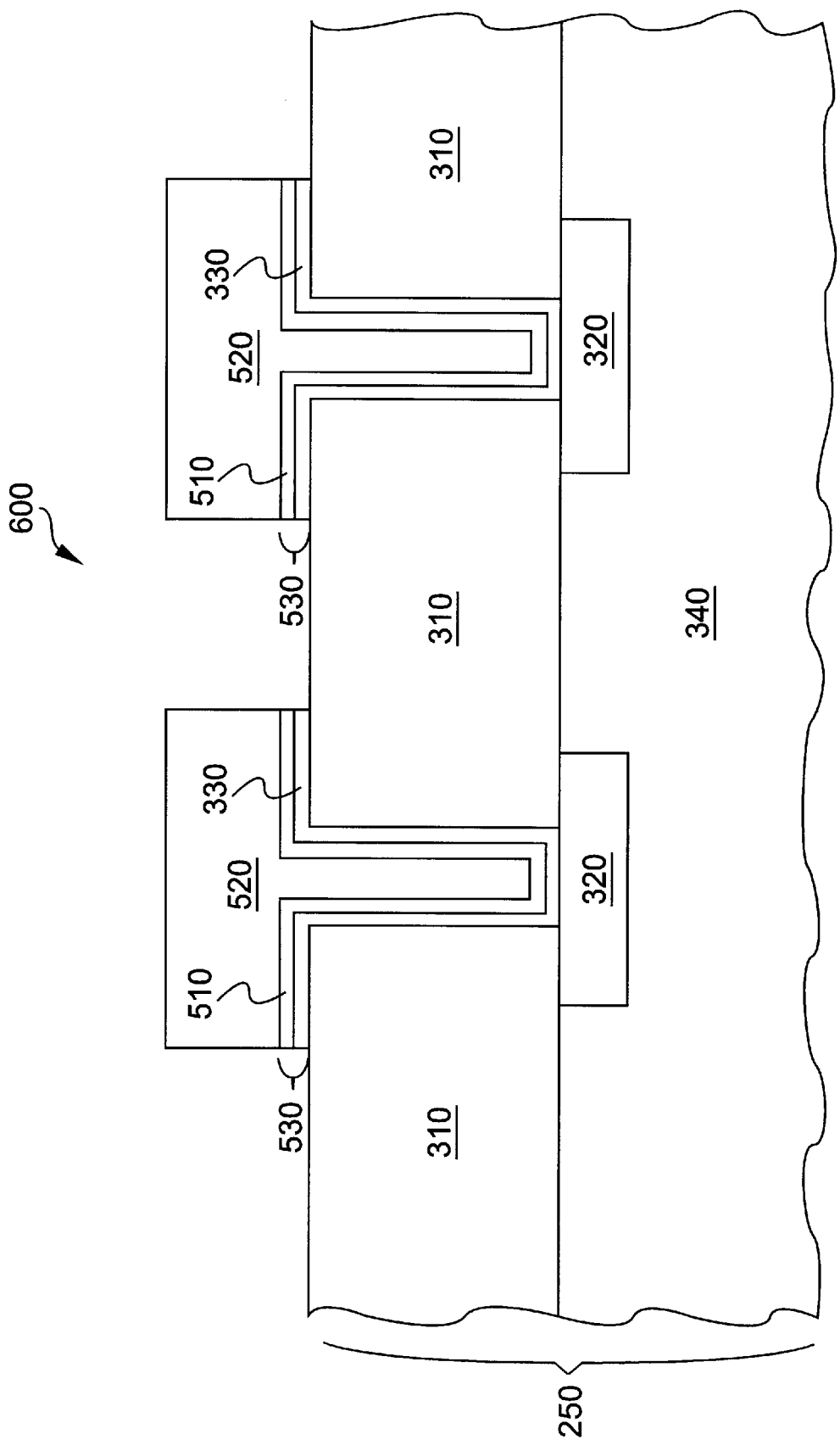
FIG. 6 is a cross-sectional view of a wafer portion that results from the method in FIG. 1.

Wafer 250 is then subjected to overburden material removal operations, as depicted in FIGS. 6 and 10. Overburden material removal operations preferably includes removal of excess conductive film or barrier 530 and fill material 520 to prevent such excess from electrically bridging contacts/connections. Removal can be by such techniques as chemical mechanical polishing, etch, or other removal methods well known in the art. Especially if using copper fill material 520, subtractive etching or polishing is preferred. FIG. 6 illustrates subtractive etching, such that fill material 520 and conductive film or barrier 530 are etched together to preferably form interconnects and contacts in one structure. FIG. 10 illustrates polishing fill material 520 and conductive film or barrier 530 down to insulating layer 310 of wafer 250 after normal fill operations. For example, in the sequentially deposited tantalum nitride/tantalum (TaN/Ta) bilayer process, fill material 520 and conductive film or barrier 530 are polished down to insulating layer 310. Because apertures 380 depicted in FIG. 10 are dual damascene structures, polishing preferably leaves both contacts and interconnects within insulating layer 310.

Thus, the combination of step 120 followed by step 130 of method 100 essentially creates a novel, specialized method for preferably creating more robust contacts and interconnects. Furthermore, method 100 avoids the problems caused by prior art conventional ionized and non-ionized deposition processes, for example, charge differentials across the wafer, high contact and via junction resistance due to contaminated metal interfaces in aperture bases between underlying areas and conductive material, and cavities in apertures with high aspect ratios.

Given the numerous options that are possible within method 100 of FIG. 1, there are numerous possibilities for structures that may be produced. FIGS. 3–6 present just one of the possible wafer portions that may result from method 100 and other wafer portions are conceivable that are within the scope of the present invention according to the preferred embodiment for method 100 shown in FIG. 1 as discussed above. The examples below set forth specific process conditions for performing various steps of method 100 and, thus, each is presented as a more preferred embodiment of method 100.

EXAMPLE 1

Wafer Preparation, General Chamber Conditions, and Possible Materials. A wafer is prepared that includes an insulating layer having a plurality of apertures to underlying areas and covering a substrate. In a typical application, the insulating layer is patterned to create the apertures. The apertures could have height and width ratios (aspect ratios) of 1:1 to 20:1. Aperture openings to underlying areas could have diameters of 0.1 to 0.8 microns.

The preferred method of the present invention may be carried out with one chamber of the same deposition apparatus or with two chambers of different deposition apparatuses. The preferred method preferably uses an Applied Materials IMP 2 sputter source process, but could also use a Novellus HCM process or a Tokyo Electron Limited (TEL) IPVD process.

Pressures in the chambers could range from 1 to 60 mTorr (absolute). Wafer temperatures could range from −150 degrees Celsius to 500 degrees Celsius. Target, and hence first and second conductive materials, could be tantalum, titanium, tungsten, copper, aluminum, cobalt, copper alloy, aluminum alloy, or cobalt alloy. However, chromium, silver, gold, platinum, or other metals, and even high temperature oxide superconductors are contemplated and can possibly be used. Furthermore, whether the step of depositing a first conductive material in a non-ionized physical vapor deposition process onto the semiconductor wafer or the step of depositing a second conductive material in an ionized physical vapor deposition process onto the semiconductor wafer is used, the deposition apparatus or apparatuses wherein the steps are performed could have an atmosphere containing nitrogen. Thus, if the target comprises material comprising tantalum, titanium or tungsten, and the first and second conductive materials will comprise stoiciometric and non-stoiciometric nitrides of tantalum, titanium or tungsten.

EXAMPLE 2

This embodiment is a process that takes place in only one chamber of one apparatus, specifically an Applied Materials IMP 2 sputter source process, wherein a step of depositing TaN through PVD takes place before the "normal" IPVD commences. Specifically, a wafer is prepared as described above that includes an insulating layer having a plurality of apertures and covering a substrate with underlying areas. Temperature controlled wafer clamping using electrostatic chucks or physical clamps, as well as non-temperature controlled and hence non-contacted wafer depositions, are all applicable and usable.

Next, argon gas and sometimes nitrogen gas are flowed within the range 1 to 150 sccm through the valve system into the chamber to attain pressures between 1 and 60 millitorr. However, nitrogen does not need to be flowed during this step. Then, the primary plasma is ignited using the DC magnetron and DC voltage only, with power levels ranging from 100 to 10000 watts, and using gas flows of between 1 and 150 sccm of both argon and nitrogen. Once the plasma is stable, TaN is deposited through PVD for between 1 and 20 seconds to attain a field thickness of 10 to 500 angstroms.

TaN is then deposited through IPVD by powering on the RF coil, which also can be a source of Ta atoms, thereby sustaining the secondary plasma. Power levels between 100 and 5000 watts are possible, in addition to all of the conditions in the deposition of TaN through PVD. Furthermore, the wafer can be biased by optional RF voltage (or DC voltage), thereby causing the wafer to attain a negative potential. Wafer depositions of 10 to 1000 angstroms are possible.

Finally, Ta is deposited through IPVD by powering on the DC magnetron and DC voltage, and by powering on the RF coil. Power levels, gas flows, and pressures can all be within the previous ranges stated. Wafer depositions of 10 to 1000 angstroms are possible. When Ta deposition is finished, all RF and DC power is stopped, as are gas flows, and the process ends with the deposition chamber vacuum pumped to allow wafer transfer.

EXAMPLE 3

This embodiment is a process that takes place in two separate chambers of two separate apparatuses, specifically an Applied Materials IMP 2 sputter source process. A wafer is prepared as described above that includes an insulating layer having a plurality of apertures and covering a substrate with underlying areas. Temperature controlled wafer clamping using electrostatic chucks or physical clamps, as well as non-temperature controlled and hence non-contacted wafer depositions, are all applicable and usable.

TaN is then deposited through PVD within a typical PVD deposition chamber containing a single DC or RF magnetron sputter source. Specifically, argon gas and sometimes nitrogen gas are flowed within the range 1 to 150 sccm through the valve system into the chamber to attain pressures between 1 and 60 millitorr. However, nitrogen does not need to be flowed during this step. Then, the primary plasma is ignited using the DC magnetron and DC voltage only, with power levels ranging from 100 to 10000 watts, and using gas flows of between 1 and 150 sccm of both argon and nitrogen. Once the plasma is stable, TaN is deposited through PVD for between 1 and 20 seconds to attain a field thickness of 10 to 500 angstroms. The target power is then turned off and the primary plasma is extinguished. When TaN deposition is finished, all DC power is stopped, as are gas flows, and the process ends with the deposition chamber vacuum pumped to allow wafer transfer.

Finally, the wafer is transported to a second IPVD deposition chamber. Again, Temperature controlled wafer clamping using electrostatic chucks or physical clamps, as well as non-temperature controlled and hence non-contacted wafer depositions, are all applicable and usable. Next, argon gas and sometimes nitrogen gas are flowed within the range 1 to 150 sccm through the valve system into the chamber to attain pressures between 1 and 60 millitorr. However, nitrogen does not need to be flowed during this step. Then, the primary plasma is ignited using the DC magnetron and DC voltage and the secondary plasma is sustained by powering on the RF coil. Power levels, gas flows, and pressures can all be within the previous ranges stated. Furthermore, the wafer can be biased by optional RF voltage (or DC voltage), thereby causing the wafer to attain a negative potential. Wafer depositions of 10 to 1000 angstroms are possible. When Ta deposition is finished, all RF and DC power is stopped, as are gas flows, and the process ends with the deposition chamber vacuum pumped to allow wafer transfer.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Similarly, unless otherwise specified, any sequence of steps of the method indicated in the drawings or herein are given as an example of a possible sequence and not as a limitation. Many modifications and variations are possible in light of the above teaching without departing from the spirit and scope of the forthcoming claims.

What is claimed is:

1. A method for lining a plurality of apertures, the method comprising the steps of:

providing a semiconductor wafer comprising an insulating layer having a plurality of apertures and covering a substrate;

depositing a first conductive material in a non-ionized deposition process onto the semiconductor wafer, thereby lining each of the plurality of apertures; and after depositing the first conductive material, depositing a second conductive material in an ionized deposition process onto the semiconductor wafer, thereby additionally lining each of the plurality of apertures and forming a barrier comprising the first and second conductive material linings, wherein the first and the second conductive materials comprise the same material.

2. The method of claim 1, wherein the method further comprises the step of depositing a fill material onto the semiconductor wafer until the fill material fills each of the plurality of apertures.

3. The method of claim 2, wherein the barrier comprises a conductive film, and wherein the method further comprises the step of performing subtractive etching to pattern the conductive film and the fill material.

4. The method of claim 2, wherein the barrier comprises a conductive film and the apertures comprise dual damascene structures, and wherein the method further comprises the step of polishing the conductive film and the fill material down to the insulating layer.

5. The method of claim 1, wherein the step of providing a semiconductor wafer comprises providing a semiconductor wafer comprising an insulating layer having a plurality of apertures opening to underlying areas and covering a substrate, and wherein the barrier comprises a conductive film so that electrical connections are formed between the conductive film and the plurality of underlying areas.

6. The method of claim 1, wherein the step of depositing a first conductive material is performed in a first deposition apparatus and wherein the step of depositing a second conductive material is performed in a second deposition apparatus.

7. The method of claim 1, wherein the step of depositing a first conductive material in a non-ionized deposition process onto the semiconductor wafer comprises depositing a first conductive material in a physical vapor deposition process onto the semiconductor wafer.

8. The method of claim 7, wherein the step of depositing a first conductive material in a physical vapor deposition process onto the semiconductor wafer further comprises the steps of providing an atmosphere containing nitrogen and providing a target, wherein the target comprises tantalum, titanium or tungsten, and wherein the first conductive material comprises nitrides of the target material.

9. The method of claim 1, wherein the step of depositing a first conductive material in a non-ionized deposition process onto the semiconductor wafer comprises depositing a first conductive material in a chemical vapor deposition process onto the semiconductor wafer.

10. The method of claim 1, wherein the step of depositing a second conductive material in an ionized deposition process onto the semiconductor wafer comprises depositing a second conductive material in an ionized physical vapor deposition process onto the semiconductor wafer.

11. The method of claim 10, wherein the step of depositing a second conductive material in an ionized physical vapor deposition process onto the semiconductor wafer further comprises the steps of providing an atmosphere containing nitrogen and providing a target, wherein the target comprises material comprising tantalum, titanium or tungsten, and wherein the second conductive material comprises nitrides of the target material.

12. The method of claim 1, wherein the steps of depositing the first and the second conductive materials are performed at an absolute pressure ranging from 1 to 60 millitorr, a temperature ranging from −150 to 500 degrees Celsius, a gas flow ranging from 1 to 150 sccm, and a power level ranging from 100 to 10,000 watts.

13. The method of claim 12, wherein each of the first conductive material and the second conductive material comprises tantalum, titanium, tungsten, copper, aluminum, cobalt, copper alloy, aluminum alloy, or cobalt alloy.

14. The method of claim 1, wherein the steps of depositing a first conductive material and depositing a second conductive material are performed in one deposition apparatus.

15. A method for forming electrical connections on a semiconductor wafer, the method comprising the steps of:

providing a semiconductor wafer comprising an insulating layer having a plurality of apertures opening to underlying areas and covering a substrate;

depositing a first conductive material in a physical vapor deposition process onto the seniconductor wafer, thereby lining each of the plurality of apertures; and after depositing the first conductive material, depositing a second conductive material in an ionized physical vapor deposition process onto the semiconductor wafer, thereby additionally lining each of the plurality of apertures and forming a conductive film comprising the first and second conductive material linings so that the electrical connections are formed between the conductive film and the plurality of underlying areas, wherein the first and the second conductive materials comprise the same material.

16. The method of claim 15, wherein the method further comprises the step of deposit a fill material onto the semiconductor wafer until the fill material fills each of the plurality of apertures.

17. The method of claim 16, wherein the method further comprises the step of performing subtractive etching to pattern the conductive film and the fill material.

18. The method of claim 16, wherein the apertures comprise dual damascene structures, and wherein the method further comprises the step of polishing the conductive film and the fill material down to the insulating layer.

19. The method of claim 15, wherein each of the plurality of underlying areas is a transistor portion, and wherein the electrical connections are contacts.

20. The method of claim 15, wherein the plurality of underlying areas are underlying metal conductive material layers, and wherein the electrical connections are interconnects.

21. The method of claim 15, wherein the step of depositing a first conductive material is performed in a first deposition apparatus and wherein the step of depositing a second conductive material is performed in a second deposition apparatus.

22. The method of claim 15, wherein the steps of depositing the first and the second conductive materials are performed at an absolute pressure aging from 1 to 60 millitorr, a temperature ranging from −150 to 500 degrees Celsius, a gas flow ranging from 1 to 150 sccm, and a power level ranging from 100 to 10,000 watts.

23. The method of claim 22, wherein each of the first conductive material and the second conductive material comprises tantalum, titanium, tungsten copper, aluminum, cobalt copper alloy, aluminum alloy, or cobalt alloy.

24. The method of claim 15, wherein the step of depositing a first conductive material in a physical vapor deposition process onto the semiconductor wafer further comprises the steps of providing an atmosphere containing nitrogen and providing a target, wherein the target comprises tantalum, titanium or tungsten, and wherein the first conductive material comprises nitrides of the target material.

25. The method of claim 15, wherein the step of depositing a second conductive material in an ionized physical vapor deposition process onto the semiconductor wafer further comprises the steps of providing an atmosphere containing nitrogen and providing a target, wherein the target comprises material comprising tantalum, titanium or tungsten, and wherein the second conductive material comprises nitrides of the target material.

26. The method of claim 15, wherein the steps of depositing a first conductive material and depositing a second conductive material are performed in one deposition apparatus.

* * * * *